United States Patent [19]
Hébert

[11] Patent Number: 4,654,687
[45] Date of Patent: Mar. 31, 1987

[54] HIGH FREQUENCY BIPOLAR TRANSISTOR STRUCTURES

[76] Inventor: Francois Hébert, 15 Romfield Circuit, Thornhill, Ontario, Canada, L3T 3H4

[21] Appl. No.: 717,118

[22] Filed: Mar. 28, 1985

[51] Int. Cl.[4] .................. H01L 29/72; H01L 29/08
[52] U.S. Cl. ........................... 357/34; 148/DIG. 11; 148/DIG. 145; 357/20; 357/36; 357/68
[58] Field of Search ................ 357/36, 20, 65, 68

[56] References Cited

U.S. PATENT DOCUMENTS

| | | | |
|---|---|---|---|
| 3,582,723 | 6/1971 | Kerr | 357/36 |
| 3,746,949 | 7/1973 | Nienhuis | 357/36 |
| 4,012,764 | 3/1977 | Satonaka | 357/36 |
| 4,072,979 | 2/1978 | Palara | 357/36 |

OTHER PUBLICATIONS

J. Andeweg & T. H. J. van den Hurk, "A Discussion of the Design & Properties of a High Power Transistor for Single Sideband Applications", IEEE Trans Electron Devices, vol. Ed. 17, Sep. 1970, pp. 714–724.
H. F. Cooke, "Microwave Transistors: Theory & Design", Proc. IEEE, vol. 59, Aug. 1971, pp. 1163–1181.
D. R. Carley, P. L. McGeough & J. F. O'Brien, "The Overlay Transistor", Electronics, Aug. 23, 1965, pp. 71–77.
M. Fukuta, H. Kisaki & S. Maekawa, "Mesh Emitter Transistor", Proc. IEEE (Lett.), vol. 56, Apr. 1968, pp. 742–743.
IBM Technical Disclosure Bulletin, vol. 15, No. 12, May 1973.
IBM Technical Disclosure Bulletin, vol. 13, No. 2, Jul. 1970.
Electronic Design, Aug. 22, 1985, pp. 37–38.
Cosand, IEEE IEDM, Dec. 1973, Technical Digest, pp. 35–37.

*Primary Examiner*—William D. Larkins
*Attorney, Agent, or Firm*—R. Craig Armstrong

[57] ABSTRACT

Structures which improve the high frequency performance of bipolar discrete or integrated transistors through minimization of base contact size and hence collector-base capacitance (and collector-substrate capacitance, if integrated), are disclosed. The transistor comprises at least one elongate emitter arm and substantially minimum-dimension base contacts positioned one facing each side of each emitter arm at at least a minimum dimension from each emitter arm. A base diffusion area is positioned under and is minimum-dimensionally larger than the outer perimeter of the areas bounded by all of the smallest imaginary triangles each including a base contact and a facing emitter arm. Specific examples are described, namely a so-called "lozenge" structure, for relatively narrow emitters, a "cross" structure for wider emitters, and a "T" structure.

14 Claims, 10 Drawing Figures

Fig. 2 A-A
(PRIOR ART)

HIGH FREQUENCY BIPOLAR TRANSISTOR STRUCTURES

BACKGROUND OF THE INVENTION

1. Field of the Invention

This invention relates to structures which improve the high frequency performance of bipolar discrete or integrated transistors.

It may easily be demonstrated that in some bipolar amplifier configurations, such as the class A tuned output common-emitter (CE) stage, maximization of the maximum oscillation frequency ($f_{max}$) yields optimal high frequency performance. The major components of $f_{max}$ are the base resistance and the collector base junction capacitance ($C_{jc}$). These device parameters need to be minimized in order to maximize $f_{max}$.

The collector base capacitance is a function of epitaxial layer doping and of device area. The base resistance is a function of the emitter aspect ratio (width to length or B/L ratio) which somewhat defines the overall transistor size.

Minimum base resistance is commonly achieved by using at least two base contacts. Also, the emitter length (where "length" is the dimension of the emitter in the direction of base current flow, i.e. perpendicular to the base contacts) should be minimized and will be defined by the design rules selected.

The base area is defined by:
(1) the emitter surface area;
(2) the base contact surface area;
(3) the spacing between the base contacts and emitter window; and
(4) a peripheral component which includes the sidewalls and the plane area from the junction edge and the base contacts.

It is clear that special technologies such as oxide isolation and polysilicon base contacts may reduce the $r_{bb}C_{jc}$ figure of merit, where $r_{bb}$ is the base resistance and $C_{jc}$ is the collector base depletion layer capacitance. However, the present invention relates primarily to the layout aspects of the transistor.

2. Description of the Prior Art

Various layout techniques have been developed over the years for bipolar transistors. Most tend to maximize the emitter periphery to area ratio in order to optimize high frequency and high power operation.

The best-known layouts used in the prior art to attempt to achieve the above goals are: (1) the overlay transistor (see J. Andeweg and T. H. J. van den Hurk, "A discussion of the design and properties of a high-power transistor for single sideband applications", IEEE Trans. Electron Devices, vol. ED-17, September 1970, pp. 717–724; H. F. Cooke, "Microwave transistors: theory and design", Proc. IEEE, vol. 59, August 1971, pp. 1163–1181; D. R. Carley, P. L. McGeough and J. F. O'Brien, "The overlay transistor", Electronics, Aug. 23, 1965, pp. 71–77); (2) interdigitated structure (see Andeweg and van den Hurk, supra, and H. F. Cooke, supra); and (3) "mesh" emitter transistors also known as the emitter grid or matrix (see M. Fukuta, H. Kisaki and S. Maekawa, "Mesh emitter transistor", Proc. IEEE (Lett.), vol. 56, April 1968, pp. 742–743; Andeweg and van den Hurk, supra; and H. F. Cooke, supra).

These geometries are compared in the literature (see Fukata et al, supra, and Andeweg and van den Hurk, supra), but generally $f_{max}$ is not considered (i.e. $r_{bb}$ or $C_{jc}$ are not evaluated) and the emitter areas are not compared. These geometries are therefore qualitatively discussed below in order to better compare them.

The most common layout technique used today, shown in FIG. 1, consists of an emitter 1 with parallel base contacts 2, one on each side of the emitter stripe. The design rules of Table 1 below are assumed:

TABLE 1

| Assumed Design Rules | |
| --- | --- |
| Minimum contact | 2a × 2a |
| Metal width | 4a |
| Metal to metal | 4a |
| Metal to contact edge | 2a |
| Contact to diffusion | 2a |
| where a is one unit length. | |

(Washed emitter process is assumed, but it is clear that the above applies to any other fabrication process (standard, polysilicon emitter, etc.))

Most of the area of the base contacts 2 and the peripheral component 3 of the device shown in FIG. 1 may be considered wasted area, and this area increases as the emitter width B is increased.

One alternative to reduce the wasted area is to use an interdigitated layout which basically shares a central base contact between two adjacent emitter stripes. Interdigitated structures yield a small area saving for wide emitter layouts (B/L of 18 or more for the above design rules). A slight reduction in collector-base area comes from the fact that the central base contact is shared by two adjacent emitters, permitting the elimination of a small area which would otherwise be duplicated. One advantage of the interdigitated structure is a reduction in emitter series resistance due to metallization.

In the case of an overlay structure, the overall base diffusion area is relatively large for a given emitter area, due to the extra spacing between each emitter island. The base resistance, although reduced due to an increase in emitter periphery, is not minimized due to the presence of the now large extrinsic component. The $f_{max}$ frequency is not much improved when compared to the interdigitated structure, at relatively low current levels.

A mesh structure is such that an improved $f_{max}$ is expected when compared to an overlay structure. This comes about due to a reduction in base diffusion area for a given emitter area, due to a minimization of the base contact area. The base resistance is reduced when compared to the interdigitated or overlay transistors, since the emitter surrounds the minimum dimension contacts. The problem associated with the mesh layout technique is that the current distribution in the emitter diffusion will be mostly limited to the centre section, where the metal is located. This current distribution will not minimize the base resistance since the effective emitter width is less than the perimeter of the emitter diffusion. Also, emitter area is increased, which will reduce the transition frequency, $f_t$ of the transistor.

SUMMARY OF THE INVENTION

It is an object of the invention to provide structures which improve the high frequency performance of bipolar discrete or integrated transistors.

Thus in accordance with the present invention there is provided a bipolar transistor comprising at least one elongate emitter arm and substantially minimum-dimension base contacts positioned one facing each side of each emitter arm at at least a minimum dimension from each emitter arm. A base diffusion area is positioned under and is minimum-dimensionally larger than the outer perimeter of the areas bounded by all of the smallest imaginary triangles each including a base contact and a facing emitter arm, where the minimum dimension is defined by the design rules applied for the selected transistor fabrication process.

In accordance with one embodiment of the present invention there is provided a bipolar transistor as above, comprising a single elongate emitter arm and two base contacts facing the centre of the emitter arm, this structure being described herein as a "lozenge" structure.

In accordance with another embodiment of the invention there is provided a bipolar transistor comprising comprising four emitter arms arranged to form a cross, and four base contacts one between each pair of adjacent arms of the cross, this structure being described herein as a "cross" structure.

In accordance with yet another embodiment of the invention, there is provided a bipolar transistor comprising three emitter arms forming a T-shape, in which the first and second emitter arms form the top of the T-shape, and the third emitter arm forms the upright portion of the T-shape. There are four base contacts, namely one positioned between the first and third emitter arms, one between the second and third emitter arms, and one each facing the centres of the first and second emitter arms above the T-shape.

Further features of the invention will be described or will become apparent in the course of the following detailed description.

BRIEF DESCRIPTION OF THE DRAWINGS

In order that the invention may be more clearly understood, the preferred embodiments thereof will now be described in detail by way of example, with reference to the accompanying drawings, in which.

DETAILED DESCRIPTION OF THE PREFERRED EMBODIMENTS

Figure 1:
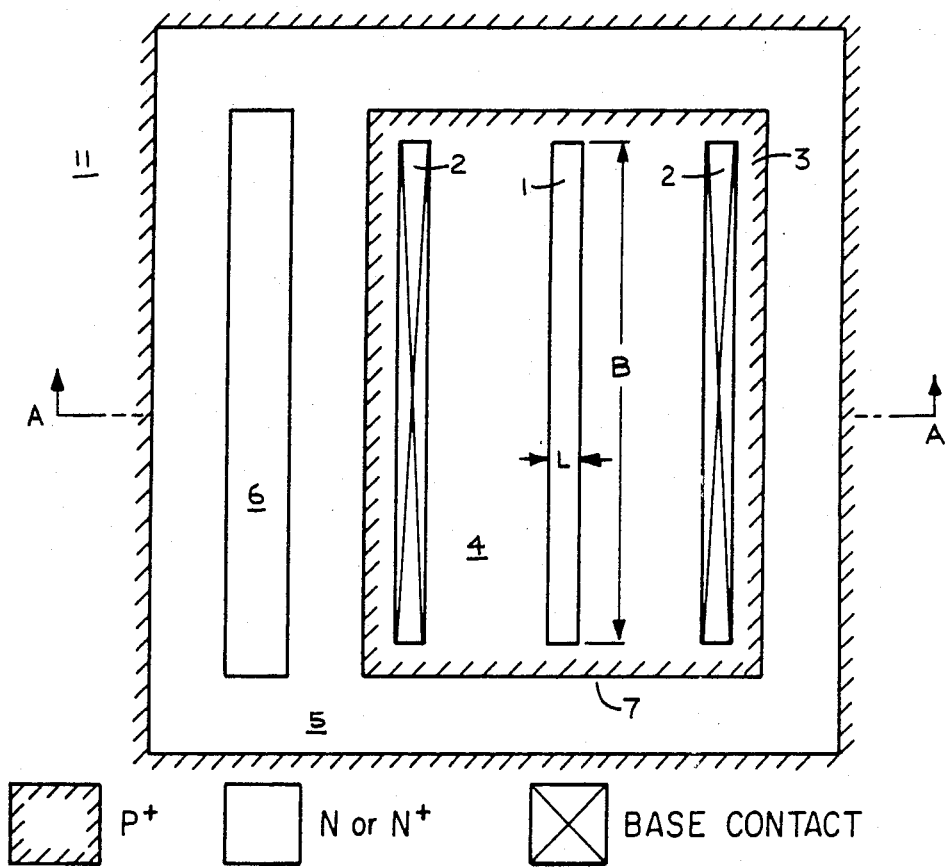
FIG. 1 (prior art) is a layout diagram of a typical integrated interdigitated transistor in the prior art, of the type having a single emitter stripe.

In the present invention, the collector-base capacitance (and collector-substrate capacitance, if integrated) is minimized by careful location of the base contacts and minimization of the base area without significantly increasing emitter current crowding. The base contact area is minimized, the actual size depending on the design rules used. The total base resistance is not significantly increased by the reduction in overall device area, and emitter area is efficiently used. The result is a significant reduction in $C_{jc}$ in comparison with typical interdigitated structures (up to 40 percent for the examples described below), yielding improved maximum oscillation frequency and improved transition frequency when compared to existing layout techniques. Since overall device area is reduced, higher packing densities are possible, which renders these structures useful for VLSI circuits. The embodiments of the invention preferably use straight lines for their construction, which facilitates design using standard software programs for mask layout.

In the structures envisioned within the scope of the invention, the transistor comprises at least one elongate emitter arm and substantially minimum-dimension base contacts positioned one facing each side of each emitter arm at at least a minimum dimension from each emitter arm. A base diffusion area is positioned under and is minimum-dimensionally larger than the outer perimeter of the areas bounded by all of the smallest imaginary triangles each including a base contact and a facing emitter arm, where the minimum dimension is defined by the design rules applied for the selected transistor fabrication process. A number of embodiments can be readily envisioned, and specific examples are described in detail herein, namely a so-called "lozenge" structure, for relatively narrow emitters, a "cross" structure for wider emitters, and a "T" structure. These structures yield smaller collector areas than overlay transistors and more efficiently use the emitter area when compared to the mesh structures. They work best as small signal amplifiers. Their geometries are compatible with standard single metal level bipolar fabrication process, and they may also be manufactured with more complex fabrication methods such as the single and double polysilicon processes.

In this specification, the term "minimum dimension" in relation to the base contacts means the smallest possible base contact dimension or other dimension in accordance with the design rules selected, which depends on the chosen fabrication technique, as is well known in the prior art.

For the specific structures described below as examples of preferred embodiments of the invention, the same design rules as described above in Table 1 are assumed, unless otherwise noted.

What links the different examples of the invention is the common principle of their layout, which is most easily understood by visualizing imaginary triangles and defining the layout in terms of the location of those triangles. If one takes each emitter arm and base contact pair, and around each pair draws the smallest possible triangle, the outer perimeter of all of those triangles essentially defines the area under which the base diffusion area lies. The base diffusion area extends beyond the area defined by that perimeter by the minimum dimension.

The "Lozenge" Structure

Figure 3:
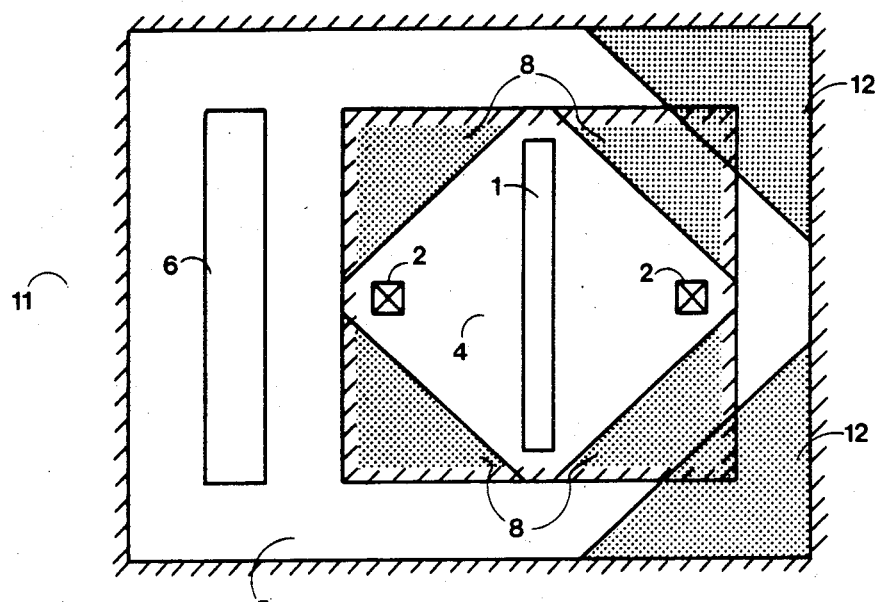
FIG. 3 is a layout diagram of a so-called "lozenge" structure of the present invention, with dotted areas showing the area eliminated in comparison with the prior art transistor of FIG. 1.
Figure 4:
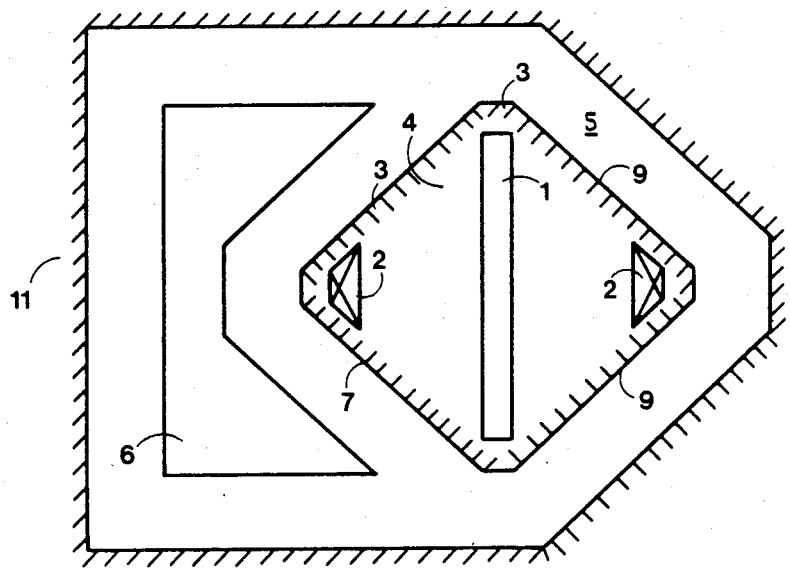
FIG. 4 is a layout diagram of the lozenge structure, showing a variation of the base contacts.

This structure is illustrated in FIGS. 3 and 4, in which are shown the base contacts 2, the emitter 1, the base diffusion area 4, the collector 5, and the collector contact diffusion 6. The area outside the collector 5 is the isolation region 11.

For relatively narrow emitters, i.e. width to length or B/L ratio of about 10 or less, the surface area of the collector-base junction 7 (see FIG. 2) may be minimized by using a minimum dimension base contact, instead of a stripe having the same width as the emitter, centrally located on each side of the emitter as shown in FIGS. 3 and 4. Then, the area of the base diffusion 4 which is not under a base contact may be eliminated, except for a minimum dimension peripheral component 3 in accordance with the selected design rules. This area saving is shown as the dotted area 8 in FIG. 3, indicating the origin of the reduction in capacitance. The layout uses two essentially minimum dimension base contacts 2, i.e. 2a×2a for the design rules of Table 1, one on each side of the emitter stripe 1. The base contacts may be made square, or could for example be trapezoidal as shown in FIG. 4. The trapezoidal shape is selected because it permits a slightly larger base contact than in the case of a square, thereby slightly reducing the base resistance, without reducing the advantages of the invention; the non-parallel sides of the trapezoid follow the straight-line base diffusion area periphery 9 at the design rules minimum distance therefrom (2a for the design rules of Table 1). The distance between the parallel sides of the trapezoid is the minimum design rules dimension. Other shapes could of course be used if desired, but such other shapes would not be optimum.

The base contacts 2 are preferably located at the minimum design rules distance from the emitter 1, which would be a distance 8a in this case (two times the 2a metal to contact edge minimum dimension, plus the 4a metal to metal minimum dimension to allow for metallization). The base contacts could be located farther away from the emitter, but there would be no reason to do so. It would be inefficient from an area viewpoint to do so, and furthermore there would be an unnecessary and undesireable increase in extrinsic base sheet resistance.

Figure 2:
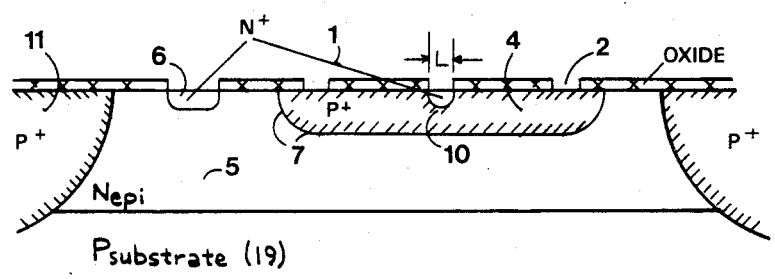
FIG. 2 (prior art) is a cross-sectional elevation of the transistor of FIG. 1, at section A—A.

The reduction in overall base diffusion area does not much increase the total base resistance since the extrinsic base sheet resistance of most devices, which is increased in the present invention, is very much less than the intrinsic base sheet resistance, i.e. the resistance in the region 10 of the base diffusion 4 beneath the emitter 1 (see FIG. 2). The collector-base capacitance (and collector-substrate capacitance in integrated circuits) is reduced since the base contact area is reduced.

This layout reduces the collector area by about 39% in the illustrated embodiment, compared to a typical interdigitated structure using the same design rules and emitter size, such as the one shown in FIG. 1. The base resistance is slightly increased due to an increase in the extrinsic component. This increase in extrinsic resistance is estimated at about 25% for the case shown, when minimum dimension contacts are used. For well designed devices (extra P+ diffusion to reduce the extrinsic resistance), the extrinsic sheet resistance is much less than the intrinsic sheet resistance and this 25% degradation will correspond to only a few percent increase in total base resistance. It should be noted that a reduction in the collector-substrate capacitance, $C_{cs}$, is also obtained, when the corners of the isolation window are chopped, as shown by the dotted area 12 in FIG. 3.

This structure is best applied as a small-signal, high frequency bipolar transistor with relatively narrow emitters (B/L ratios from 1 to about 20 depending on the design rules used).

The "Cross" Structure

The "lozenge" structure is not practical for very large B/L ratios, since the ends of the emitter 1 would be too remote from the base contacts 2. This leads to the introduction of the so-called "cross" structure shown in FIG. 5. It uses a cross-shaped emitter 1 with four minimum dimension triangular base contacts 2 between the arms of the cross, each one adjacent to two arms of the cross. Other base contact shapes, such as a square, could be used, but with some loss of optimization. As for the lozenge structure, the base contacts are preferably located at the minimum design rules distance from the emitter arms. The collector-base capacitance (and collector-substrate capacitance if used in integrated circuits) is reduced since the overall base diffusion surface area is reduced. The total base resistance is only increased slightly due to an increase in the extrinsic component, as described above, when compared to equal emitter area standard layouts, but performance is improved due to greatly decreased base area.

The example shown, assuming the Table 1 design rules, yields a B/L ratio of 40 (low $r_{bb}$) with an area 40% smaller than the interdigitated case or 44% smaller than the single stripe case, for equal emitter lengths. The extrinsic base resistance is increased by approximately 25% but the intrinsic component is hardly affected. It should be observed that minimization of the $C_{cs}$ component is also obtained.

Figure 6:
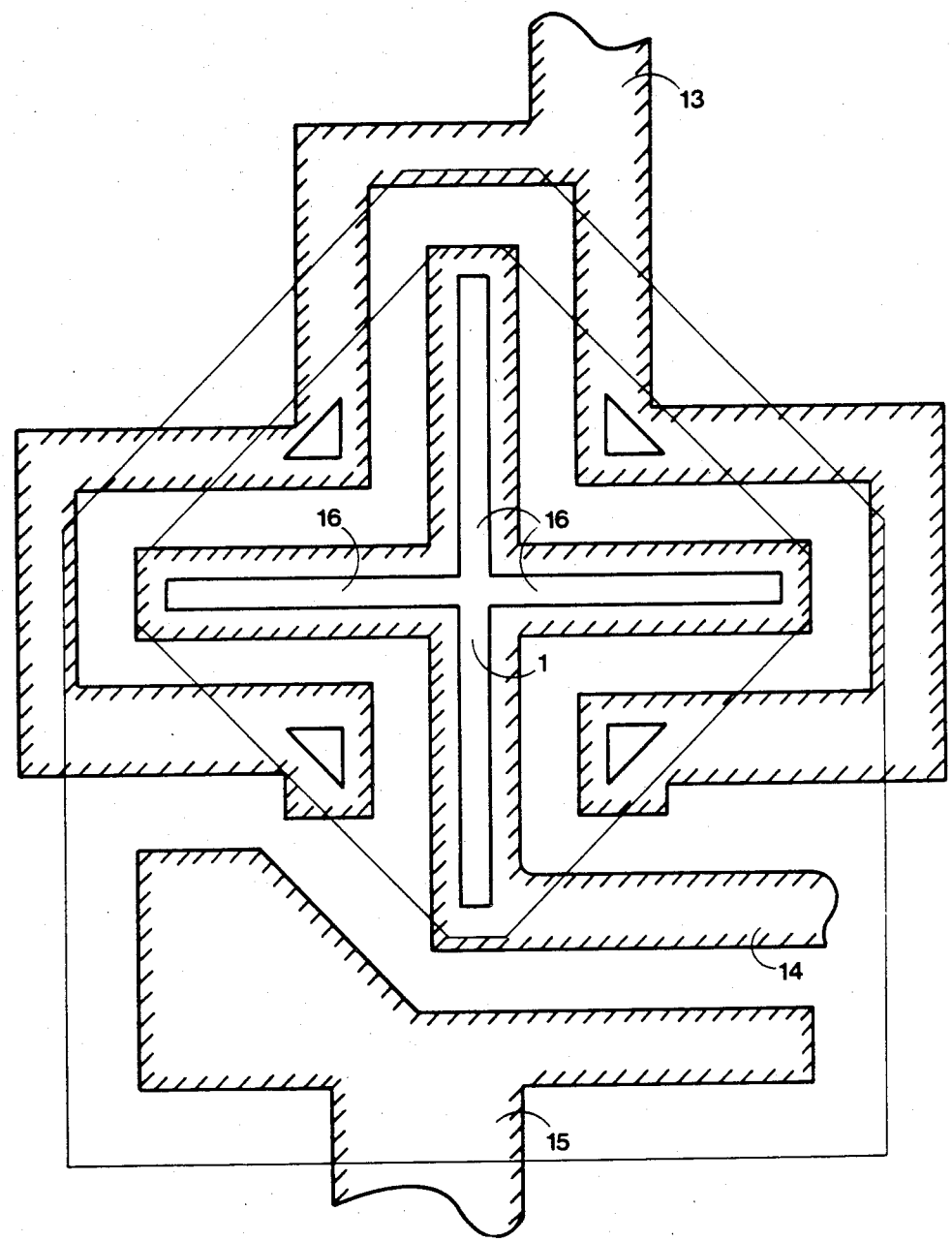
FIG. 6 is a drawing showing typical metallization for the cross structure.

Metallization to such a structure can be done as shown in FIG. 6, showing the base metal 13, the emitter metal 14, and the collector metal 15. The emitter 1 is entirely covered with metal, which improves current distribution and efficiently uses the emitter area, while respecting the design rules. This layout yields emitter resistances, due to metallization resistance, lower than the single stripe case but slightly larger than the interdigited case due to the current sharing in the top three arms 16 of the cross.

It should be observed that the "cross" layout is particularly well suited for polysilicon contacted emitter transistors, or polysilicon contacted emitter and base transistors (super self aligned or double polysilicon process). As an example, FIG. 7 demonstrates the appearance of the base region of a 6.5×0.5 micron$^2$ double polysilicon transistor using for example the design rules of the "SST-1A" process described by M. Susuki et al, "A bipolar monolithic multigabit/s decision circuit", IEEE J. Solid State Circuits, vol. SC-19, August 1984, pp. 462–467, including oxide isolation. A savings of approximately 30% is realised over the Susuki et al geometry (7.8 versus 11.05 micron$^2$), and since double polysilicon is used, interconnection between base contacts and metallization to the emitter is simplified. Also, the closeness of the base contacts 2 to the emitter 1 obtained by using polysilicon for the base, minimizes the increase of the extrinsic base resistance to only a few percent, when compared to the standard layout. The collector contact can simply be made on one or more sides of the base, leaving enough space for the base contacts.

Figure 7:
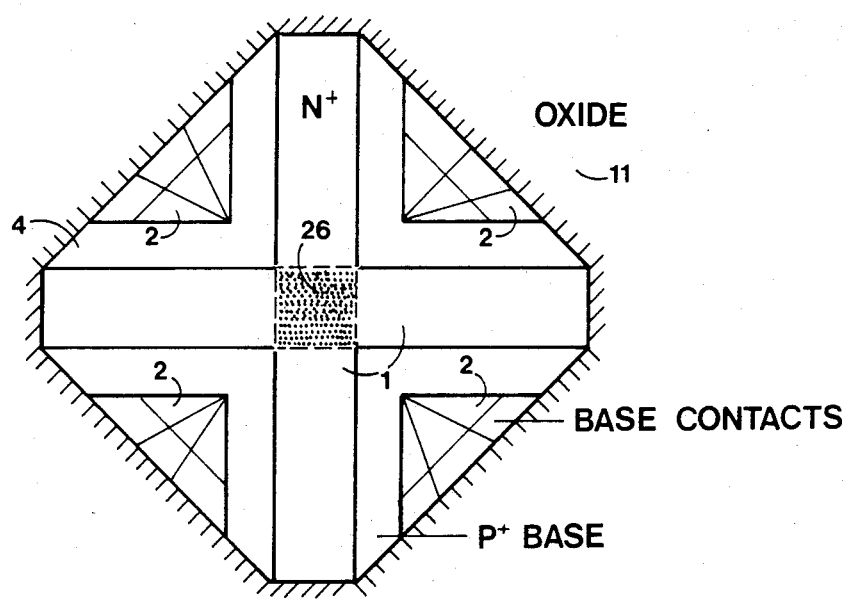
FIG. 7 is an illustration of the appearance of the base region of a "double polysilicon" transistor made by a super self-aligned (SST), oxide-isolated process.

One modification possible to the "cross" structure is to remove the center area 26 of the cross (shown dotted in FIG. 7). This may improve the performance by reducing the emitter capacitance while not affecting much current distribution. This may not prove useful when small design rules are used due to the planarization problems encountered during metallization.

The cross structure is best applied as a small-signal high frequency bipolar transistor with a relatively wide emitter (large B/L ratio).

Other Structures

It should be readily apparent that structures with any practical number of emitter arms may also be designed, depending on the emitter width required and the design rules used. One can readily envision a structure having five or six or more arms for example, using the above-described principles.

Figure 8:
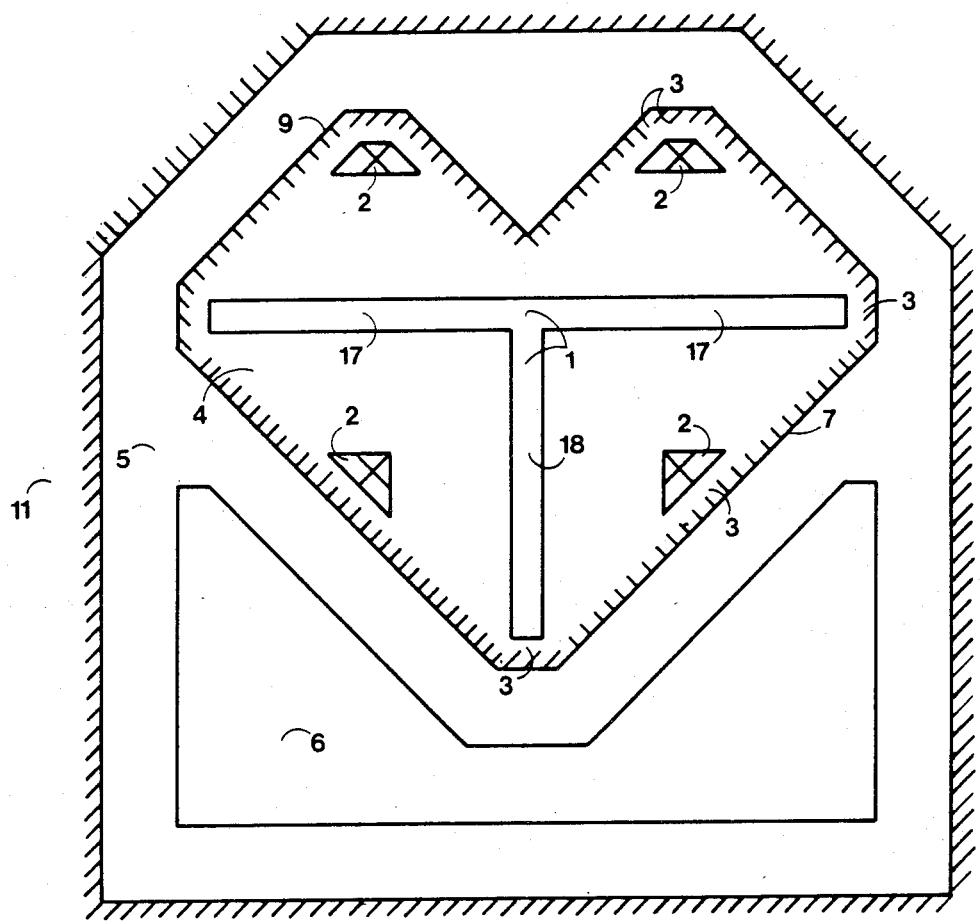
FIG. 8 is a layout diagram of a T-shaped structure of the present invention.

As another example, a "T" structure such as the one illustrated in FIG. 8 can be envisioned. This T structure can be viewed either as a four-armed cross with one arm removed, or simply as a three-armed emitter, two arms 17 forming the top of the "T", and one arm 18 forming the upright portion. As in the case of the other described structures, minimum dimension base contacts 2 are provided at minimum distance from the emitter arms, with the base diffusion area being reduced accordingly.

General

Figure 5:
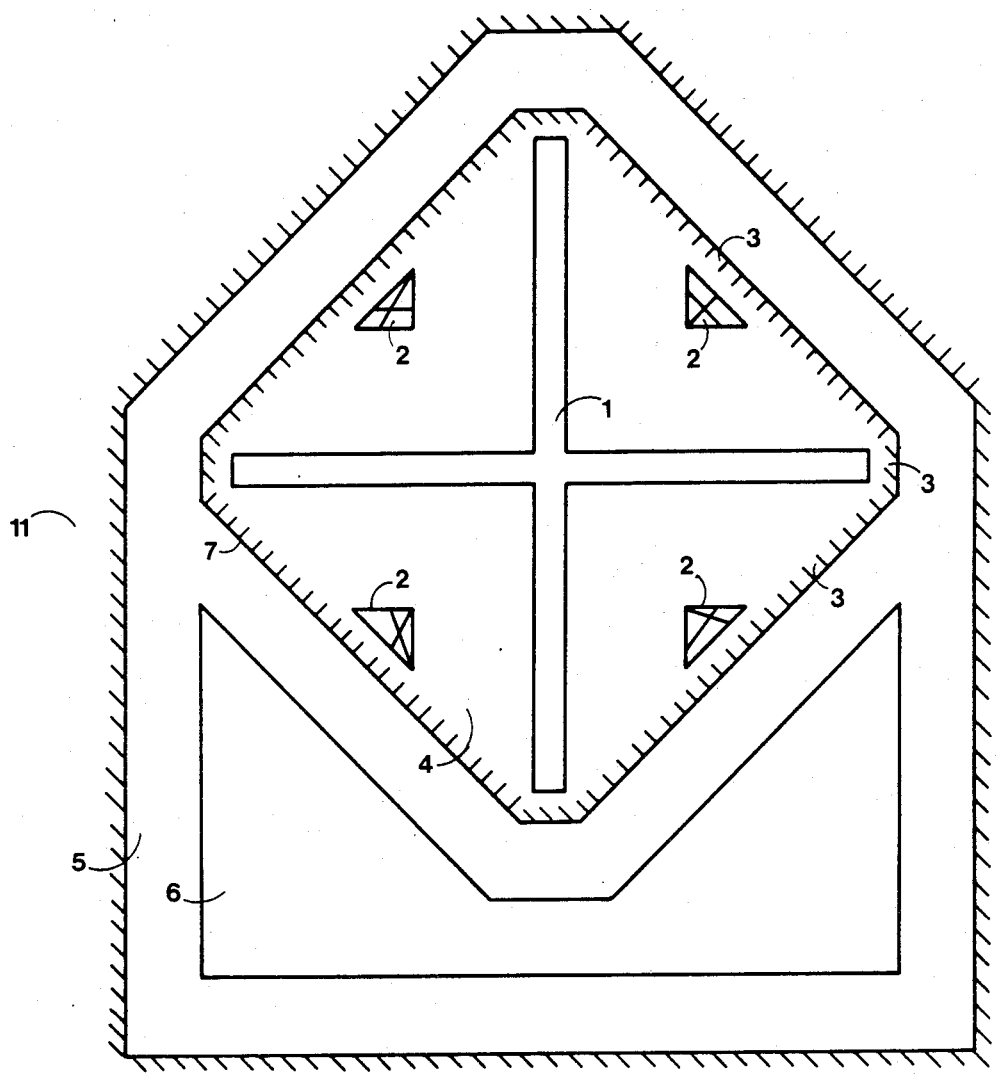
FIG. 5 is a layout diagram of a so-called "cross" structure of the present invention.

The structures of the present invention may be used as discrete or integrated circuit devices, aimed primarily at low to medium current, high frequency applications. The integrated circuit versions have been described above. It should be observed that the collector contact diffusions 6 (integrated circuit version), as shown in FIGS. 4 and 5, can be made larger (when compared to the standard structures, FIG. 1 for example), due to the shape of the base diffusion 4. That is, the collector contact diffusion shape can follow the shape for the base diffusion, separated only by the design rules minimum dimension. This can help in the metallization and may reduce the parasitic collector resistance.

For discrete use, it can simply be shown that the same base and emitter layout is used, with the substitution of the P substrate 19 (see FIG. 2) for an N type substrate. Collector contact is therefore achieved by connection to the substrate, which can be N+, so as to reduce the parasitic collector resistance. Oxide isolation may be used in order to reduce the peripheral collector-base capacitance. If no oxide isolation is used, the boundary of the base diffusion will delimit the transistor area. Metallization to the lozenge structure is standard (as per the interdigitated prior art structure) and requires one connection to the emitter stripe and two connections to the base contacts, which are brought to one side of the chip, to bonding pads. For the cross structure, metallization can be similar to FIG. 6 or lower contact resistances can be obtained by using two separate bonding pads and associated lines to the emitter, and similarly for the base contacts.

Figure 9:
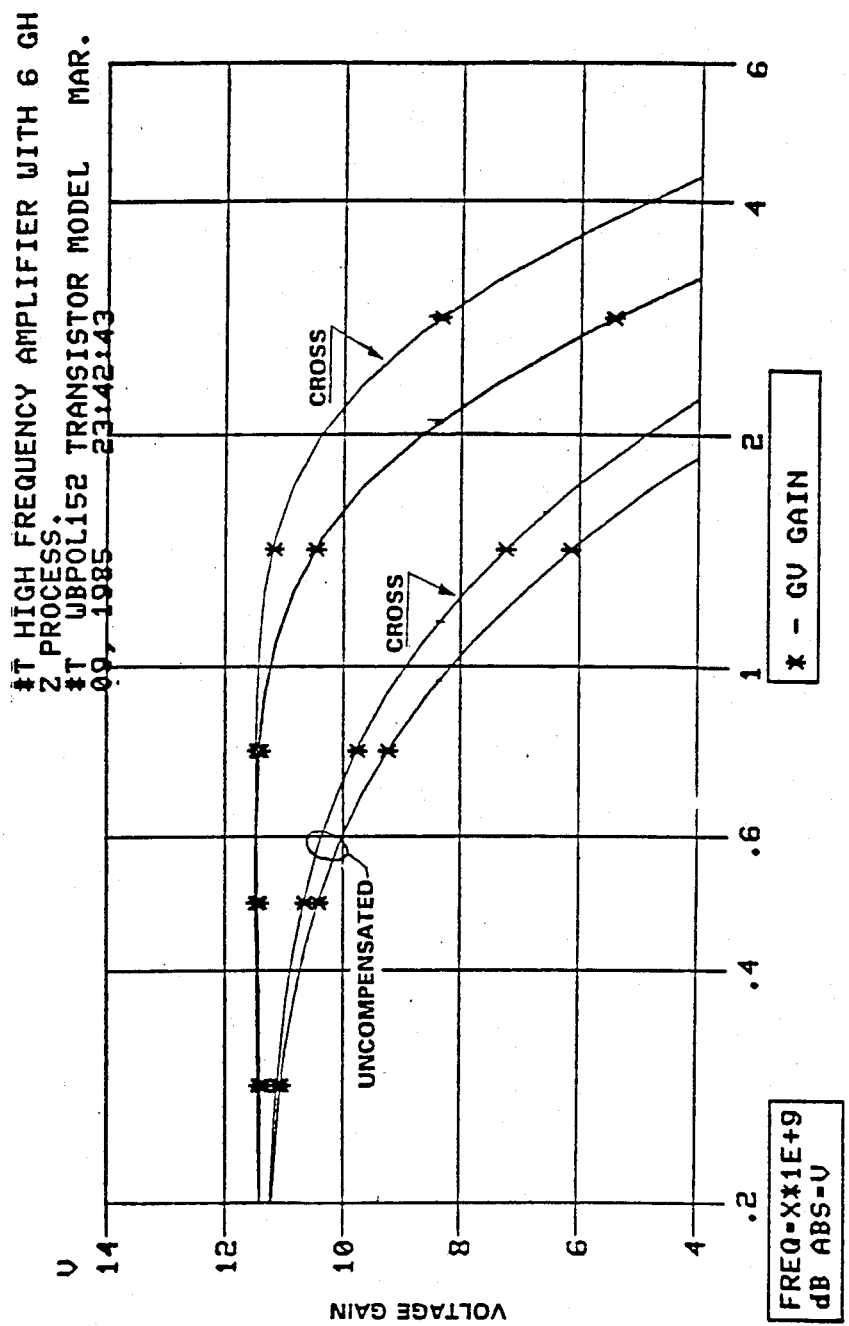
FIG. 9 is a comparative graph showing frequency response of the present invention in comparison with the typical prior art.
Figure 10:
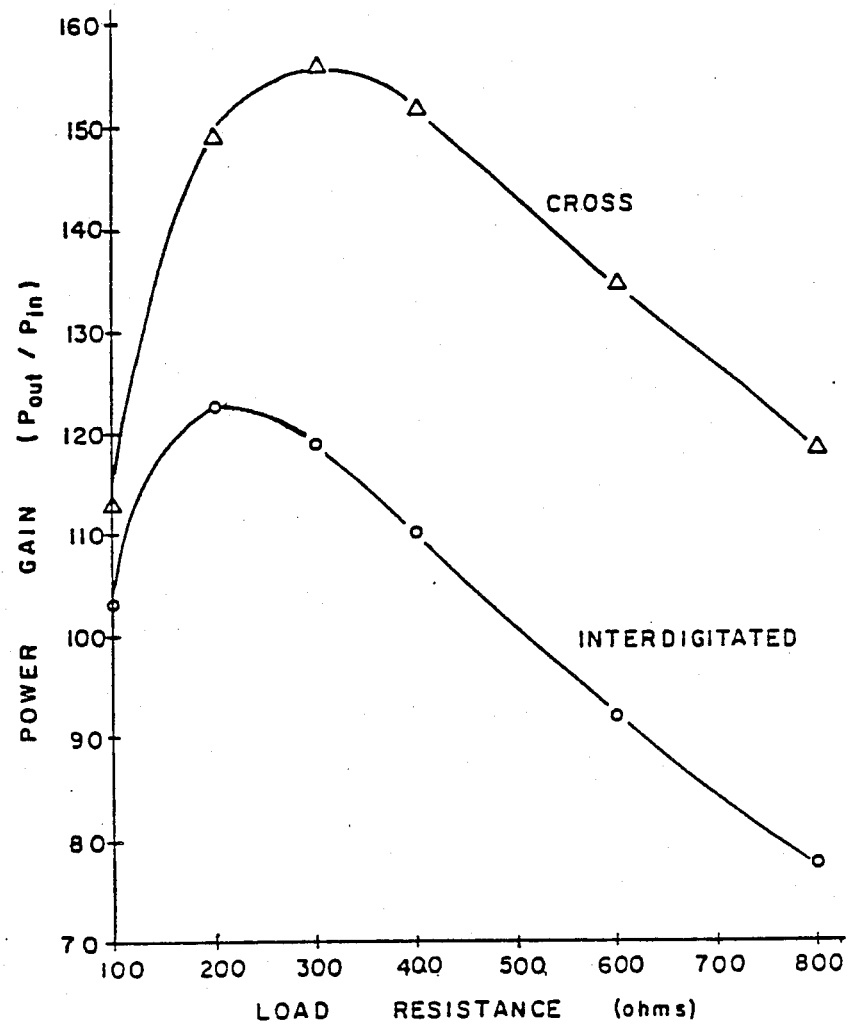
FIG. 10 is a comparative graph showing maximum power gain of the present invention in comparison with the typical prior art.

In order to assist in an understanding of the performance improvement offered by the present invention, FIGS. 9 and 10 are provided, both obtained from computer simulations.

FIG. 9 shows the frequency response of a common-emitter amplifier with degeneration (emitter resistor of 100 ohms). A cross transistor is compared to a single stripe transistor, the base area of the two transistors being equal. The dimensions of the cross transistor are 1.5×28 microns, while those of the interdigitated transistor are 1.5×15 microns. Compensation (or peaking) is done with a capacitor across the emitter resistor. FIG. 9 shows roughly a 35% improvement in compensated 3 dB bandwidth for the cross structure, and roughly a 20% improvement in uncompensated 3 dB bandwidth.

FIG. 10 provides a comparison of maximum power gain ($G_p$). This is simulated using a distributed small signal model. The frequency selected is 85 MHz and both devices are made by the same process or technology. Each have an equal emitter area of 6×165 micron$^2$. A 27% improvement in maximum power gain is obtained when the cross geometry is used over the two-stripe interdigitated device geometry. The above agrees with the theoretical expression:

$$G_p = f_t/(8\pi r_{bb}C_{jc}f^2)$$

where f equals 85 MHz in this case.

It will be appreciated that the above description relates to the preferred embodiments by way of example only. Variations obvious to those knowledgeable in the field are considered to be within the scope of the invention as described and claimed, whether or not expressly described.

For example, it should be obvious to the reader that design rules other than those described in Table 1 above could apply, which would change the dimensions and appearance of the structures somewhat.

Furthermore, it would be possible to use a base diffusion area which was slightly more than minimum-dimensionally larger than the outer perimeter of the areas bounded by all of the smallest imaginary triangles each including a base contact and a facing emitter arm, although such a larger base diffusion area would not be taking optimum advantage of the collector-base capacitance reduction opportunities afforded by the invention. The invention provides a means for reducing such capacitance, and any layout which uses the principle is considered to be within the scope of the invention, whether or not the full advantage of the invention is taken.

What is claimed as the invention is:

1. A bipolar transistor comprising at least one elongate emitter arm substantially two unit lengths by at least about sixteen unit lengths, base contacts less than about eight unit lengths squared in area positioning one facing each side of each said emitter arm at at least about eight unit lengths from each said emitter arm, and a base diffusion area under and extending about two unit lengths beyond the area defined by the outer perimeter of the areas bounded by all of the smallest imaginary triangles each including a base contact and a facing emitter arm.

2. A bipolar transistor as recited in claim 1, comprising a single elongate emitter arm and two base contacts facing the centre of said emitter arm.

3. A bipolar transistor as recited in claim 2, in which said base contacts are trapezoidal, the longer of each base contact's parallel sides facing the emitter, the shorter of each base contact's parallel sides being about two unit lengths in length, the distance between parallel sides being about two unit lengths, and the non-parallel sides paralleling the perimeter of said base diffusion area at a distance of about two unit lengths therefrom.

4. A bipolar transistor as recited in claim 1, comprising four emitter arms integrally arranged with ends abutting at right angles to each other to thereby form a cross shape, and four base contacts one between each pair of adjacent arms of said cross shape.

5. A bipolar transistor as recited in claim 4, in which said base contacts are each in the shape of a right-angled isosceles triangle of about two unit lengths in height, the sides adjacent the right angles facing and paralleling said emitter arms, the bases of the triangles paralleling the perimeter of said base diffusion area at a distance of about two unit lengths therefrom.

6. A bipolar transistor as recited in claim 1, comprising three emitter arms integrally arranged with ends abutting each other to form a T-shape, in which the first and second emitter arms form the top of the T-shape, and the third emitter arm forms the upright portion of the T-shape, and further comprising four base contacts, one positioned between said first and third emitter arms, one between said second and third emitter arms, and one each facing the centres of said first and second emitter arms above the T-shape.

7. A bipolar transistor as recited in claim 6, in which said base contacts facing the centres of said first and second emitter arms above the T-shape are trapezoidal, the longer of each base contact's parallel sides facing the emitter, the shorter of each base contact's parallel sides being about two unit lengths in length, the distance between parallel sides being about two unit lengths, and the non-parallel sides paralleling the perimeter of said base diffusion area at a distance of about two unit lengths therefrom, and in which the base contacts positioned between said first and third emitter arms and said second and third emitter arms are each in the shape of a right-angled isosceles triangle of about two unit lengths in height, the sides adjacent the right angles facing and paralleling said emitter arms, the bases of the triangles paralleling the perimeter of said base diffusion area at a distance of about two unit lengths therefrom.

8. A bipolar transistor as recited in claim 1, in which said base contacts are positioned at a distance of about eight unit lengths from each said emitter arm.

9. A bipolar transistor as recited in claim 2, in which said base contacts are positioned at a distance of about eight unit lengths from each said emitter arm.

10. A bipolar transistor as recited in claim 3, in which said base contacts are positioned at a distance of about eight unit lengths from each said emitter arm.

11. A bipolar transistor as recited in claim 4, in which said base contacts are positioned at a distance of about eight unit lengths from each said emitter arm.

12. A bipolar transistor as recited in claim 5, in which said base contacts are positioned at a distance of about eight unit lengths from each said emitter arm.

13. A bipolar transistor as recited in claim 6, in which said base contacts are positioned at a distance of about eight unit lengths from each said emitter arm.

14. A bipolar transistor as recited in claim 7, in which said base contacts are positioned at a distance of about eight unit lengths from each said emitter arm.

* * * * *